United States Patent [19]

Hornig

[11] 3,956,658

[45] May 11, 1976

[54] LOW IMPEDANCE SWITCH

[75] Inventor: Donald F. Hornig, Milwaukee, Wis.

[73] Assignee: The United States of America as represented by the United States Energy Research and Development Administration, Washington, D.C.

[22] Filed: Nov. 28, 1945

[21] Appl. No.: 631,419

[52] U.S. Cl. .................................. 313/217; 315/73
[51] Int. Cl.² ..................... H01J 17/04; H01J 61/06
[58] Field of Search .......................... 315/39, 73, 85; 313/217, 218, 197, 313; 250/27.5

[56] References Cited
UNITED STATES PATENTS

| | | | |
|---|---|---|---|
| 1,564,694 | 12/1925 | Lerchen | 174/35 |
| 1,787,689 | 1/1931 | Lederer | 313/193 |
| 2,034,756 | 3/1936 | Hansell | 330/41 |
| 2,238,025 | 4/1941 | Miller | 174/17.08 |
| 2,265,632 | 12/1941 | Coffin | 339/136 |
| 2,403,303 | 7/1946 | Richmond | 325/23 |
| 2,404,116 | 7/1946 | Wolowicz et al. | 74/401 |

Primary Examiner—Maynard R. Wilbur
Assistant Examiner—T. M. Blum
Attorney, Agent, or Firm—Dean E. Carlson; Paul D. Gaetjens

EXEMPLARY CLAIM

1. A low inductance switch comprising a pair of spaced apart, annularly shaped, plate members of conducting material supported in substantially parallel, insulated relationship, said plate members being provided with a plurality of radially extending, spoke-like extensions whereby said members may be connected into a plurality of electrical circuits, and an electrical discharge means connected across said spaced plate members for effecting the simultaneous closing of the electrical circuits connected thereto, said electrical discharge means including an elongated, sealed envelope which contains an ionizable gas and which is supported on one of said plate members with the major axis of said envelope extending generally perpendicular to the plane of said plate members, a pair of elongated, spaced apart, insulated electrodes supported within said envelope and extending axially thereof, one of said electrodes being connected to each of said plate members, and a third, firing or trigger electrode supported within said envelope intermediate said main electrodes and being insulated from said main electrodes.

2 Claims, 3 Drawing Figures

WITNESSES.
Ralph Carlisle Smith
Paul J. Glaister

INVENTOR.
DONALD F. HORNIG
BY
Robert A. [signature]

LOW IMPEDANCE SWITCH

The present invention relates to electrical switching means, and particularly to electrical switching apparatus adapted for effecting the simultaneous closing of a plurality of electrical circuits within very short intervals of time.

In certain types of ordnance and other equipment, it is necessary to energize a relatively large number of electrical circuits within periods of time of the order of 0.05 to 0.5 microseconds. While it is usually possible to reduce the inductance and capacitance of the various conductor elements of the circuits to be energized to a sufficiently low value to permit operation within time intervals of this very small magnitude, considerable difficulty has been experienced in the provision of satisfactory switching equipment. Most, although not all mechanical devices are inherently too slow to be of value, and in various of the other proposed switching devices, extreme difficulty has been experienced in lowering the inherent inductance of the device to a sufficiently low value to make possible the desired, multiple circuit, switching operation within the required time interval.

The principal object of the present invention therefore, is to provide improved switching apparatus for effecting the simultaneous closing of a plurality of electrical circuits of the type described above. A more specific object of the invention is to provide an improved switching means of sufficiently low inductance and capacitance and having such operational characteristics, that the simultaneous closing of a multiplicity of controlled circuits can be effected within a period of time of the order of 0.05 to 0.5 microseconds.

As will hereinafter appear, these objects are accomplished by the provision of an improved, multiple circuit, electrical switch and switching system which utilizes a single gas discharge device for closing all of the controlled circuits. The system includes means whereby breakdown of the gas discharge switching device and energization of the controlled circuits is effected from a single potential source, despite the fact that the normal breakdown voltage of the gas discharge switching means is normally considerably higher than this potential. The various novel features of the low inductance electrical switch and high speed switching system of the present invention will be made more apparent in the accompanying drawings and the following description of one preferred embodiment thereof.

Figure 1:
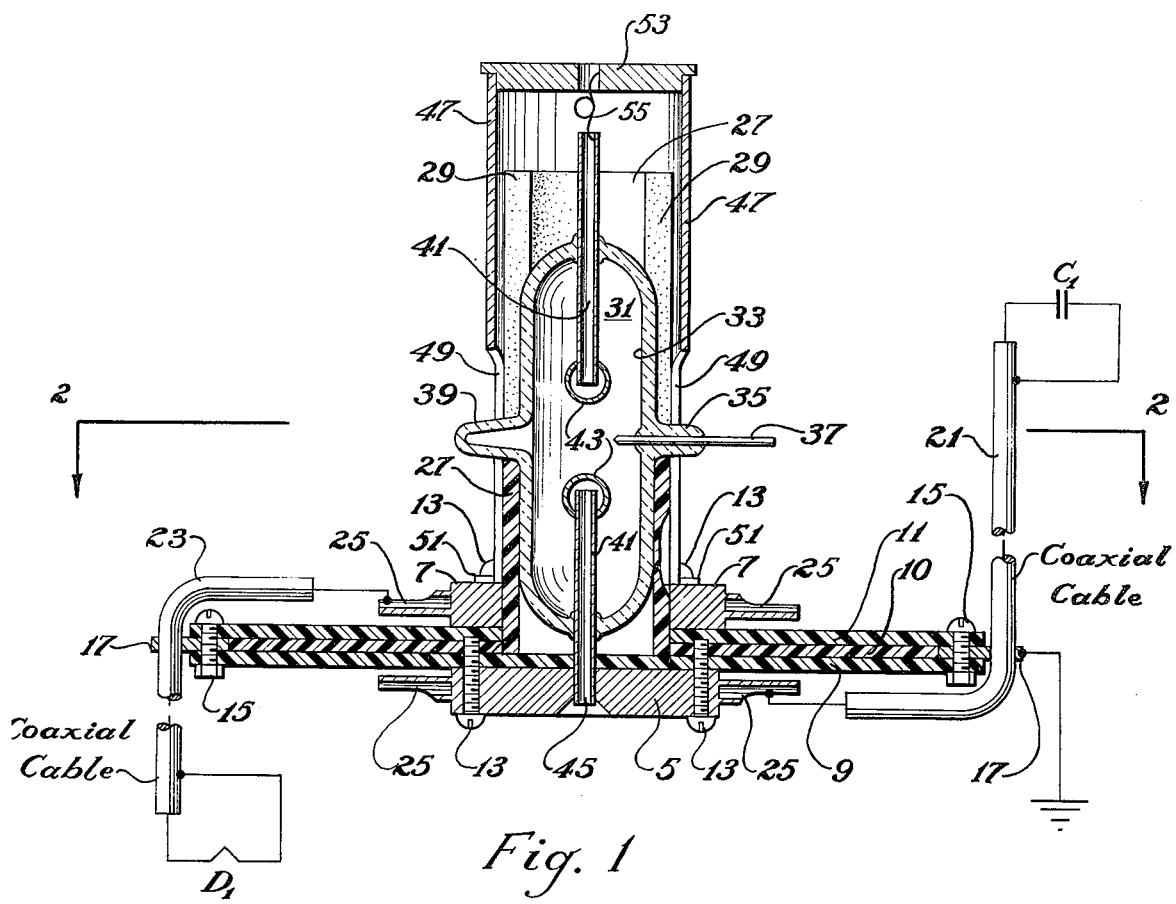
FIG. 1 is a sectional view through a low inductance switch embodying principles of the invention. Exemplary circuit connections are illustrated diagrammatically in this Figure.

As illustrated, the low inductance switch of the invention includes a pair of annularly shaped plate members 5 and 7 of conducting material which are supported in spaced apart, substantially parallel, insulated relationship by means of three circular discs, 9, 10 and 11, of insulating material and a plurality of angularly displaced screws 13, which engage suitable threaded openings provided within the insulating discs. The edges of the discs 9, 10 and 11 are held together by spaced, peripherilly disposed, screw fastenings 15 which also serve to support a metallic ground ring 17, as illustrated. The ground ring 17 is provided with spaced openings 19 adapted to receive the coaxial cables which are preferably employed in making the electrical connections in the system of which the switch constitutes a part. Two such coaxial cables are shown at 21 and 23 in FIG. 1.

Each of the plate members 5 and 7 is provided with a plurality of radially extending, spoke-like, extensions 25, which may comprise tubular connector lugs, as illustrated, in order that one side of each of the multiplicity of circuits which are to be controlled by the switch may be connected thereto. The plate members 5 and 7 are supported concentrically with respect to each other, and the upper member 7 is provided with a substantially larger central opening than the lower plate member 5 for receiving a cylindrical sleeve 27 of insulating material which is provided with diametrically opposed slots 29 at its upper end, as illustrated.

The gas discharge device 31, which is utilized for electrically connecting the plate members 5 and 7 and thus the plurality of electrical circuits connected thereto, includes a cylindrical glass envelope 33 which is adapted to fit snugly within the insulating sleeve 27. The two slots 29 in the sleeve 27 accommodate a press seal 35, provided at one side of the envelope 33 for supporting a trigger electrode 37 and a tubular extension 39, provided at the other side of the envelope 33 for facilitating the filling of the envelope 33 with a gas. Two axially extending, centrally disposed, main electrodes 41, are sealed into the opposite ends of the envelope 33 by conventional seals, and each of the main electrodes 41 terminates in a ball shaped end portion 43. The trigger electrode 37, which is positioned so as to extend into the envelope 33, intermediate the main electrodes 41, is desirably provided with a pointed end.

The external shank portion 45 of the lower of the main electrodes 41, extends through the central opening provided in the lower connector plate 5 and through an aligning opening in the insulating disc 9. It is electrically and mechanically connected to the lower connector plate 5. A cylindrical sleeve or shield 47 of conducting material, having a pair of diametrically opposed slots 49, is disposed about the insulating sleeve 27 and the gas discharge device 31, which is contained therein. The conducting sleeve 47 is provided with four angularly displaced feet or brackets 51 which are adapted to be engaged by the screw fastenings 13 used for supporting the upper connector plate 7, as illustrated. By this means the conducting sleeve or shield 47 is mechanically supported in place so as to provide a coaxial shield for the gas discharge device 31, and is electrically connected to the upper connector plate 7. The upper end of the shield 47 is closed by a suitable disc 53 and the disc 53 is electrically connected to the upper of the main electrodes 41 by means of a spring wire connection 55.

During use of the device it is contemplated that the envelope 33 shall be filled with an ionizable gas which may be introduced into the envelope 33 through the inlet tube 39 during manufacture. Such gases as nitrogen, argon, neon, hydrogen, krypton and the like are suitable. The selection of the gas and the pressure at which the gas is maintained within the envelope 33 will be determined primarily by the voltage at which the discharge device is to be used, and extensive data concerning gap breakdown voltages is available in the art.

Normally, full circuit potential will be impressed across the main electrodes 41, and as a result, the spacing of the electrodes 41 and the gas pressure must be such that breakdown will not result at the operating potential. At the same time, the device must be capable of breakdown when a voltage pulse of reasonable magnitude is applied between the trigger electrode 37 and one of the main electrodes 41, that method being the preferred firing or circuit closing procedure.

Figure 3:
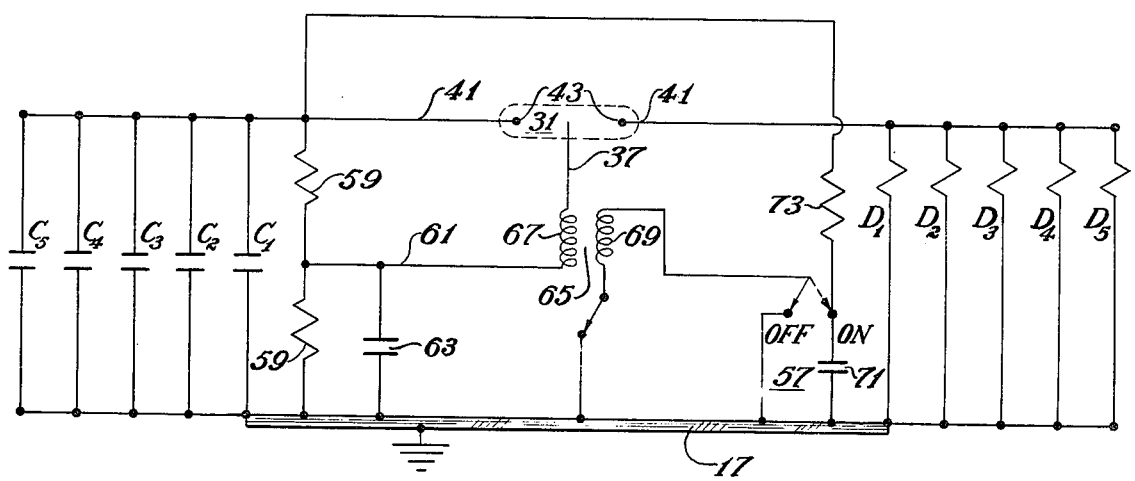
FIG. 3 is a diagrammatic view illustrating a switching system in accordance with the invention.
Figure 2:
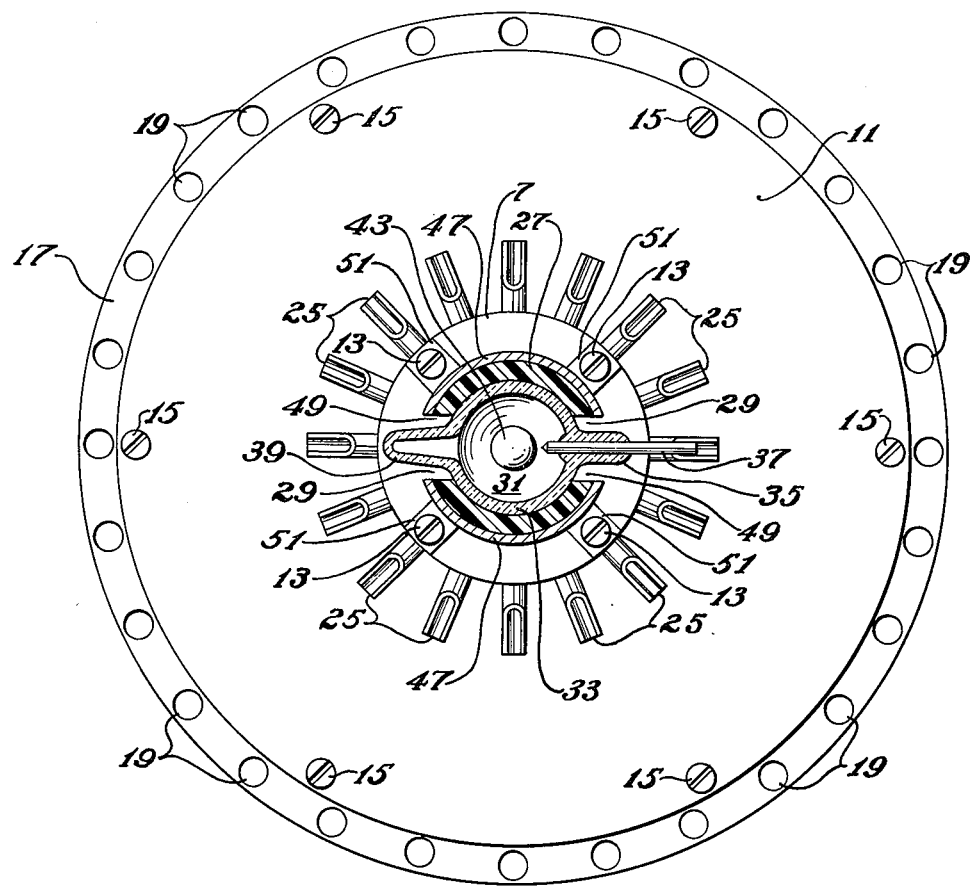
FIG. 2 is a sectional view on the line 2–2 of FIG. 1.

A circuit illustrating one electrical switching system particularly adapted for use with the switch means of the invention is illustrated in FIG. 3.

This system includes a plurality of parallel circuits D1, D2, D3, D4, and D5 which are to be energized simultaneously by operation of the gas discharge switching means 31, and a bank of condensers, C1, C2, C3, C4, and C5, which are also connected in parallel and which, when charged, constitute the single power source of the system. The circuits D1 to D5 may constitute detonators or other circuit elements. One side of each of the paralleled circuits D1 to D5 is connected to the ground ring 17, and the other side is connected to one of the electrodes 41. The condensers C1 to C5 are similarly connected with one side of each of the paralleled units, being connected to the ground ring 17 and the other side to the other electrode 41, as illustrated.

In order to lower the overall inductance of the system to the minimum possible value, the electrical connections to the condensers C1 to C5 and the connections to the paralleled circuits D1 to D5 are desirably made by means of coaxial cables, as illustrated diagrammatically at 21 and 23 in FIG. 1. The outer conductor in each instance extends through one of the openings 19 provided in the ground ring 17, and is electrically connected thereto. It will be apparent that the arrangements provided by the spoke-like, terminals or extensions 25 forming a part of the plate members 5 and 7, greatly facilitate the connecting of the coaxial cables.

The particular system illustrated in the drawings, includes five condenser units, C1 to C5 and five detonator or other circuits to be energized, D1 to D5. It will be understood that any number of circuits or condenser units may be used, within the capacity of the device, although to minimize space requirements it is usually convenient to provide the same number of condensers as there are circuits to be energized. When the system is to be used to simultaneously energize a plurality of detonators, the paralleled condenser units may conveniently be charged to voltage of the order of 5000 to 15000 volts and should have a total capacity of the order of ½ to 1 micro-farad for each circuit to be energized.

In addition to the circuit elements described, the system includes means for maintaining the trigger electrode 37 at a potential midway between that impressed across the main electrodes 41, and means for providing a high voltage pulse of sufficient magnitude to initiate breakdown within the gas discharge device 31 upon the operation of a suitable control switch which may be of the type indicated at 57. The means for maintaining the trigger electrode 37 at a potential intermediate the potential of the two main electrodes 41, comprises a pair of high ohmage resistance units 59, series connected across the paralleled condenser units C1 to C5 to provide a voltage divider circuit. The trigger electrode 37 is connected to the mid point of the series connected resistors 59 by a suitable conductor as shown at 61. For voltages of the order desirably employed in circuits of this type, that is 5000 to 15000 volts, the resistances 59 should be of the order of 20 to 50 megohms. To prevent any transient voltage or charge induced in the voltage divider circuit from producing accidental sparkover between the trigger electrode 37 and one of the main electrodes 41, a by-pass condenser 63, which may have a capacity of the order of 0.1 to 0.01 micro-farads, is connected across the active section of the voltage divider resistances 59. Due to the relative positioning of the trigger and main electrodes 37 and 41, the breakdown potential between the trigger electrode 37 and either of the main electrodes is considerably lower than the breakdown potential between the main electrodes. This aids in assuring positive and reliable operation of the gas discharge device 31.

The means for producing a high voltage peak between the trigger electrode 37 and one of the main electrodes 41, when it is desired to energize circuits D1 to D5, includes a transformer 65 which may be a Tesla coil or the like, having a secondary winding 67, which is connected in series with the conductor 61 from the voltage divider resistances 59 to the trigger electrode 37, and a primary winding 69 which is connected so as to receive the charge of a small condenser 71 when the control switch 57 is moved from the position shown in full in FIG. 3 to the position shown in dotted in that Figure. One side of the condenser 71 is connected to the ground ring 17, and the other side is connected to the high side of the paralleled condenser units C1 to C5 through a suitable charging resistance 73, which may be of the order of ten megohms.

The control switch 57 is a single pole, double throw switch which is connected so as to short-circuit the primary 69 of the transformer unit 65 when in the off position and is operable to connect the pulsing condenser 71 so as to discharge the charge accumulated therein when moved to the on position. When readying the system for operation, the control switch 57 will be placed in the off position, the main condenser bank C1 to C5 will be charged to the desired voltage, and simultaneously the pulsing condenser 71 will also be charged. The electrical characteristics of the system components are such that all of the condensers will hold their charges for as long a period as may be expected to elapse prior to the operation of the system.

When operation of the system and energization of the various parallel circuits D1 to D5 is to be effected, the control switch 57 will be moved to the dotted position of FIG. 3, thereby discharging the pulsing condenser 71 through the primary 69 of the high voltage transformer 65. This discharge will impress a high voltage pulse between the trigger electrode 37 and one of the main electrodes 41 of sufficient magnitude to produce ionization and insulation breakdown across the main electrodes 41 within the envelope 33. The main condenser bank will then discharge through the various paralleled circuits which are to be energized. By virtue of the low inductance of the gas discharge switching means 31 and the associated circuit connections, it is possible to effect simultaneous energization of all of the various connected circuits D1 to D5 within periods of time of the order of 0.05 to 0.5 microseconds, following the closing of the main control switch 57. It will be understood that the main control switch may be of an automatic or any other desired type. In ordnance application it will conveniently comprise a fuse type switch. It will also be understood that the usual safety and arming switches can be introduced into the system for added safety and to prevent premature operation of the system. The electrical switch of the invention and the switching systems which are made possible by the use of that switch are much more reliable and positive in operation than the previously known devices, and are completely free from the various defects of those devices. The extremely short period of operation which is an inherent feature of the switch is due in large part to its low inherent inductance and capacitance which characteristics result from the particular structural arrangements disclosed, included among which are the annularly shaped main connector elements and the co-axial shielding provided for the current carrying electrode. The features of the invention which are believed to be new are expressly pointed out in the appended claims.

We claim:

1. A low inductance switch comprising a pair of spaced apart, annularly shaped, plate members of conducting material supported in substantially parallel, insulated relationship, said plate members being provided with a plurality of radially extending, spoke-like extensions whereby said members may be connected into a plurality of electrical circuits, and an electrical discharge means connected across said spaced plate members for effecting the simultaneous closing of the electrical circuits connected thereto, said electrical discharge means including an elongated, sealed envelope which contains an ionizable gas and which is supported on one of said plate members with the major axis of said envelope extending generally perpendicular to the plane of said plate members, a pair of elongated, spaced apart, insulated electrodes supported within said envelope and extending axially thereof, one of said electrodes being connected to each of said plate members, and a third, firing or trigger electrode supported within said envelope intermediate said main electrodes and being insulated from said main electrodes.

2. A low inductance switch comprising a pair of spaced apart, annularly shaped, plate members of conducting material supported in substantially parallel, insulated relationship, said plate members being provided with a plurality of radially extending, spoke-like extensions whereby said members may be connected into a plurality of electrical circuits, an electrical discharge means connected across said spaced plate members for effecting the simultaneous closing of the electrical circuits connected thereto, said electrical discharge means including an elongated, sealed, cylindrically shaped, glass envelope which contains an ionizable gas and which is supported on one of said plate members with the major axis of said envelope extending generally perpendicular to the plane of said plate members, a pair of elongated, spaced apart, electrodes, each of which terminates in a ball shaped end portion, supported centrally within said envelope and extending coaxially therewith, said main electrodes being insulated from each other and each of said main electrodes being connected to one of said plate members, and a third, firing or trigger, electrode, having a pointed end, which is supported so as to extend into said envelope intermediate said main electrodes, said third electrode being insulated from said main electrodes, and a cylindrical shield member of conducting material which is connected to one of said plate members and which extends about said envelope coaxially therewith.

* * * * *